United States Patent
Gomm et al.

(10) Patent No.: US 7,728,639 B2
(45) Date of Patent: *Jun. 1, 2010

(54) TRIMMABLE DELAY LOCKED LOOP CIRCUITRY WITH IMPROVED INITIALIZATION CHARACTERISTICS

(75) Inventors: Tyler Gomm, Boise, ID (US); Eric Booth, Boise, ID (US); Jongtae Kwak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/247,672

(22) Filed: Oct. 8, 2008

(65) Prior Publication Data

US 2009/0027094 A1 Jan. 29, 2009

Related U.S. Application Data

(63) Continuation of application No. 11/676,854, filed on Feb. 20, 2007, now Pat. No. 7,443,216.

(51) Int. Cl.
*H03L 7/06* (2006.01)
(52) U.S. Cl. .................. 327/158; 327/149; 327/161; 365/233.1
(58) Field of Classification Search ............... 327/141, 327/144, 146, 149, 150, 152, 153, 155, 158, 327/159, 161–163; 365/233.1
See application file for complete search history.

(56) References Cited

U.S. PATENT DOCUMENTS

| | | | |
|---|---|---|---|
| 7,076,012 B2 | 7/2006 | Dermott et al. | |
| 7,111,185 B2 | 9/2006 | Gomm et al. | |
| 7,190,201 B2 | 3/2007 | Haerle et al. | |
| 7,212,053 B2 | 5/2007 | Gomm et al | |
| 7,332,950 B2 | 2/2008 | Blodgett | |
| 7,443,216 B2 * | 10/2008 | Gomm et al. | ............... 327/158 |
| 2006/0265622 A1 | 11/2006 | Gomm et al. | |
| 2007/0171760 A1 | 7/2007 | Gomm et al. | |
| 2008/0136475 A1 | 6/2008 | Gomm et al. | |

\* cited by examiner

*Primary Examiner*—Lincoln Donovan
*Assistant Examiner*—Patrick O'Neill
(74) *Attorney, Agent, or Firm*—Wong, Cabello, Lutsch, Rutherford & Brucculeri, LLP

(57) ABSTRACT

Disclosed herein is improved delay locked loop (DLL) initialization circuitry that alters the measurement used to initialize the variable delay line's delay (e.g., entry point or exit point) by using three clock phases: the DLL reference clock (input to the delay line), the reference clock as trimmed by a delay Tref, and the feedback clock as trimmed by a delay Tfb. By using these three phases at the appropriate time, the measurement is aware of the Tac trim for both positive (Tref) and negative (Tfb) trims. Specifically, measurement 'start' and 'stop' signals each pass through only one of delays Tref and Tfb, such that error in the measurement is a function of both Tref and Tfb. This improves the accuracy of the measurement such that additional shifting of the DLL is not necessary after initialization, and allows a wide trim range even for high clock frequencies.

28 Claims, 4 Drawing Sheets

TRIMMABLE DELAY LOCKED LOOP CIRCUITRY WITH IMPROVED INITIALIZATION CHARACTERISTICS

CROSS REFERENCE TO RELATED APPLICATIONS

This is a continuation application of U.S. patent application Ser. No. 11/676,854, filed Feb. 20, 2007, to which priority is claimed and which is hereby incorporated by reference in its entirety.

FIELD OF THE INVENTION

Embodiments of this invention relate to a delay locked loop circuitry useable in an integrated circuit such as a Synchronous Dynamic Random Access memory (SDRAM).

BACKGROUND

Delay locked loops (DLL) have many uses in integrated circuits, and generally operate to form a stable output clock signal from an input clock signal. A typical DLL 10 is shown in FIG. 1. As shown, the DLL 10 derives an output clock signal (ClkOut) from an (usually external) input clock signal (ClkIn), in which the phase or delay between the two clocks can be tightly controlled. The DLL 10 comprises a variable delay line (VDL) 12 for providing a variable amount of delay to the input clock signal, and a delay model 14. As is known, the delay model 14 models delays outside of the loop, such as those provided by the input buffers 13, and other delays such as the output buffers, the clock distribution network, etc., which are shown collectively for simplicity in FIG. 1 as buffer 15.

Ignoring Tac trim circuitry 20 for the moment, the output of the delay model 14 and the input clock signal, ClkIn, are compared at a phase detector 16, which essentially determines whether one of these signals is lagging or leading the other, and seeks to bring these two phases into alignment. For example, if the output of the delay model 14 leads ClkIn, then the phase detector 16 outputs an "Up" signal, which increases the delay through the VDL 12 by moving entry point (EP) to the left in FIG. 1. (As is known, the entry point (EP) dictates the stage at which the input clock enters the VDL 12. However, and to the same effect, the entry point can also be fixed at the left most stage of the VDL 12 with the exit point out of the VDL varying to vary the delay through the VDL. For simplicity, this disclosure discusses a variable entry point instead of a variable exit point, although the technique is equally applicable to a VDL with a variable exit point). By contrast, if the output of the delay model 14 lags ClkIn, then the phase detector 16 outputs a "Down" signal to decrease the delay through the VDL 12 by moving the entry point (EP) to the right. Through this scheme, the output clock signal, ClkOut, can eventually be locked into a phase relationship with the input clock signal, ClkIn. Further details concerning the architecture and control of a variable delay line useable in a DLL can be found in U.S. patent application Ser. No. 11/608,903, filed Dec. 11, 2006, which is incorporated herein by reference in its entirety.

As alluded to earlier, trim circuitry 20 is provided to add delay into the signals being input to the phase detector 16. When the DLL 10 is used in a Synchronous DRAM (SDRAM) for example, such circuitry can be referred to as Tac trim circuitry 20, because such circuitry generally compensates for the access time (Tac) at which data output is valid relative to the external clock, ClkIn. As one skilled in the art understands, Tac is generally specified by the manufacture of the SDRAM device, and may be tailored to suit a customer's preference. Tac is also a function of processing and other variations.

The Tac trim circuitry 20 compensates for the effect of Tac in the DLL 10. So as to reduce the minimum DLL's forward-path delay, the Tac trim circuitry 20 is placed outside of the DLL's forward path, and instead is placed in front of the phase detector 16. As one skilled in the art will understand, such placement of the Tac trim circuitry 20 reduces power supply sensitivity, jitter, and power consumption.

Preferably, the Tac trim circuitry 20 is divided into individual delays 20a and 20b: delay 20a provides a delay of Tref to the buffered input clock; while delay 20b provides a delay of Tfb to the clock as fed back from the output of the VDL 12. Generally, each of these delays 20a, 20b are programmable, such as by blowing fuse links, etc. Having separate delays Tref and Tfb in the Tac trim circuitry 20 allows the Tac to be adjusted positively or negatively, which again may be desirable to suit a particular customer's requirements or to compensate for processing and/or other variations. If an increase in Tac is desired, Tref is programmed for a longer delay. If a decrease in Tac is desired, Tfb is programmed for a longer delay.

It is desirable in a synchronous DRAM to produce an output clock signal which is in phase with the input clock signal, taking into account the Tac trim adjustment. In other words, and referring to the various time delays between the input and output clock in FIG. 1, the condition in which the two clocks are appropriately synchronized is:

$$Tvd1(ideal)+Td1+Tid+Td2=N*Tck \qquad \text{(Eq. 1)}$$

where N equal a positive integer, Tck equals the period of the input clock, Td1 equals the delay inherent in the buffer 13 (and any other delay prior to the DLL 10), Td2 equals the delays inherent in the buffer 15 (e.g., clock distribution circuitry, tree drivers, output latches, output drivers, etc.), Tid comprises delays inherent in entering and exiting the VDL 12, and Tvd1(ideal) equals the ideal delay through the VDL 12 to achieve a lock condition. In other words, the VDL 12 inserts enough delay so that the entire forward path of the DLL 10 is exactly an integer multiple of the clock period (N*Tck).

Note that in Equation (1), all of the time delays are generally constant, except for Tvd1, the variable delay through the VDL 12. Because of this, realization of the lock condition of Equation (1) generally requires proper setting of Tvd1, in other words:

$$Tvd1(ideal)=N*Tck-(Td1+Tid+Td2) \qquad \text{(Eq. 2)}$$

Therefore, for the DLL 10 to achieve a lock condition quickly, Tvd1 is preferably initialized to a value which satisfies the lock condition of Equations (1) and (2). This means that the entry point (EP) (or exit point if that varies) of the VDL 12 must be properly initialized so that the buffered input clock signal (from buffer 13) enters the VDL 12 at an appropriate stage.

Such initialization of the VDL 12 generally employs a measurement taken prior to useful operation of the device, which can be performed after power up of the device for example. Such a measurement is described with reference to FIG. 2, which shows the initialization circuitry portion 75 of the DLL 10. Because FIG. 2 only shows those aspects of the DLL circuitry useful during initialization, additional circuitry is shown when compared to FIG. 1, and some other circuitry not implicated during the initialization measurement (e.g., the phase detector 16) is not shown.

The DLL initialization circuitry 75 of FIG. 2 uses clock timing signals to measure Tvd1 (Tvd1(meas)), which value is then loaded into the VDL 12 to initialize it close to the ideal value (Tvd1(ideal)). The approach is similar to a stopwatch, in which one clock signal starts the timing and another clock signal stops the timing. To quickly summarize, a clock is inserted into the VDL 12 at (B). This clock is allowed to propagate through some number of stages in the VDL 12 until another clock (C) arrives at the VDL 12 and captures the 'distance' (i.e., number of stages) that clock (B) has traveled in the VDL 12. In this sense, the clock (B) is the 'start' signal and the clock at (C) is the 'stop' signal.

This process is now discussed in further detail. The 'start' clock pulse begins at point (A). Because the multiplexer (MUX) control signal 30' of MUX 30 is set by DLL initialization logic 50 to choose the bottom input through the entirety of the measurement process, the 'start' clock pulse does not (yet) enter the VDL 12. (Note that the control signal 30' for MUX 30 will choose the top input during normal operation, i.e., after initialization). Instead, the 'start' clock pulse passes through the Tref delay 20a, where it encounters another MUX 32. This MUX's control signal 32' initially passes the top input, and now the 'start' clock pulse passes to the VDL 12. (Again, MUX 30 allows the bottom input to pass). Because the initialization logic 50 initially sets the EP to a minimum values, Tvd1=0, and instead the 'start' clock pulse encounter only the VDL 12's intrinsic delays (Tid).

Thereafter, the 'start' clock pulse passes through the delay model 14, though Tfb delay 20b, where it triggers Flip-Flop 22a (at which point the pulse is converted to an edge). At this point, the control 32' for MUX 32 now chooses the just-latched 'start' edge (i.e., the bottom input), and passes it to point (B). At this point, the MUX 30 allows this 'start' signal (again, now an edge) to pass to the VDL 12. Now, the initialization logic 50 sets EP to a maximum value, such that the 'start' signal now enters the first (left most) stage in the VDL 12. (Alternatively, in embodiments in which the exit point varies, the exit point would be set all the way to the right most stage). Thereafter, the 'start' signals runs through the stages of the VDL 12 where it is then captured as explained below in reference to the 'stop' clock pulse.

However, prior to discussing the 'stop' clock pulse, we can see that the time it takes for the 'start' signal to get to the start of the VDL 12, i.e., from point (A) to point (B), is:

Start signal from (A) to (B)=Tref+Tmeas+Tid+
Tmodel+Tfb+Tlatch+Tmeas                                     (Eq. 3)

The 'stop' clock pulse also begins at point (A), but uses a later clock pulse some N cycles after the pulse used as the 'start' clock pulse discussed above. This later clock pulse does not pass through the VDL 12, but instead goes directly to point (C) through Tref delay 20a, to latch 22b (where it is converted to an edge), and to strobe circuitry 24. Because the 'stop' signal starts some N*Tck after the 'start' signal, the time it takes for the stop signal to transgress its route is:

Stop signal from (A) to (C)=N*Tck+Tref+Tlatch+
Tstrb                                                         (Eq. 4)

As noted above, the point of the 'stop' signal is to capture the 'start' clock pulse as it eventually transgresses through the VDL 12. This is illustrated in FIG. 3. As shown, the VDL 12 is formed of several stages 40a-40h, each connected to a latch 42a-h. When the 'stop' signal (C) is asserted, the 'start' signal (B) which has otherwise been propagating through the stages 40a-h of the VDL is captured using the stop signal as the latches' control signal. This captured value provides a measurement of Tvd1 (Tvd1(meas)) that should approximately meet the lock condition of Equations (1) and (2), and this measurement is expressible as a number of VDL stages 40. For example, and as the chart in FIG. 3 shows, should the 'start' signal only propagate through one stage 40a before being captured by the 'stop' signal, this suggests the Tvd1 should initially be set to a low value—i.e., one VDL stage 40h—to meet the lock condition. In other words, based on such a measurement, the initial entry point (EP) for the input clock into the VDL 12 would occur at VDL stage 40h. If the 'start' signal propagates through two VDL stages 40a and 40b before being captured, then Tvd1 would need to comprise two VDL stages. In other words, the initialized entry point (EP) would be chosen as 40g, such that the input clock would initially pass through two delay stages 40g and 40h in the VDL 12. (In embodiments in which the exit point varies, the captured 'start' signal would not need to be "flipped" as the initialized point in the VDL 12: For example, if the 'start' signal propagates through two VDL stages 40a and 40b before being captured, then Tvd1 would need to comprise two VDL stages, and the initialized exit point would be chosen as 40b).

To summarize, this initialization measurement technique allows the entry point (EP) (or exit point in such embodiments) into the VDL to be initially set at a value generally corresponding to the lock condition of Equations (1) and (2). However, this measurement has its shortcomings.

The measured delay, Tvd1(meas), equals the difference between the stop and start signals:

Tvd1(meas)=Stop−Start

Tvd1(meas)=N*Tck+Tstrb−Tid−Tmodel−Tfb−
2*Tmeas                                                      (Eq. 5)

As one might expect, the measured Tvd1(measured) will differ from the ideal Tvd1(ideal), and this difference can be quantified as error. Using Equations (2) and (5), and noting that Tmodel is designed to equal Td1+Td2, this error can be computed as follows:

Error=Tvd1(meas)−Tvd1(ideal)=N*Tck+Tstrb−Tid−
Tmodel−Tfb−2*Tmeas−[N*Tck−(Td1+Tid+
Td2)]=Tstrb−Tfb−2*Tmeas                                       (Eq. 6)

Tstrb and 2*Tmeas are static, and can be trimmed out of the measurement using tuning delays. Tfb is variable, and as noted earlier can be used to decrease Tac. However, despite being variable, Tfb is also known to the device, and can likewise be trimmed out of the measurement. In other words, to the extent delays in Tstrb, Tfb, and Tmeas exist as error in Equation (6), they can be accounted for to mitigate error in the measurement, and to initialize the entry point (EP) of the VDL 12 to an appropriate number of stages to achieve a lock.

However, to the extent Tref is used to increase Tac, the measurement technique as just described will not be aware of such an adjustment. This is because the error term of Equation (6) is not a function of Tref, and hence it cannot be known to what extent Tref will cause Tvd1 as measured, Tvd1(meas), to deviate from the ideal, Tvd1(ideal). Accordingly, no adjustment to the number of VDL stages 40 can be made to compensate for the programmed delay in Tref. Instead, the DLL 10 must perform a gradual iterative adjustment of the entry point (EP) (or exit point) after initialization, which increases DLL lock time.

More troubling, such unawareness of the trimmed value Tref increases the possibility that the DLL 10 will shift the input clock, ClkIn, in the wrong direction to establish a lock. This is likely to happen, for example, if the trim to Tref is greater than half of the clock period, Tck, which might occur due to process deviations or design changes that are not reflected in the delay model 14. Again, this is time and power consuming, and increases the jitter-related error. Moreover, as clock speeds increases, i.e., as Tck shrinks, the possibility of non-optimal initialization is becoming more problematic.

The art would be benefited by improved methods and circuitry for the initialization of a DLL architecture, and this disclosure provides such a solution.

BRIEF DESCRIPTION OF THE DRAWINGS

Embodiments of the inventive aspects of this disclosure will be best understood with reference to the following detailed description, when read in conjunction with the accompanying drawings, in which.

DETAILED DESCRIPTION

Improved DLL initialization circuitry alters the measurement used to initialize the VDL's delay (e.g., entry point or exit point) by using three clock phases: the DLL reference clock (input to the delay line), the reference clock as trimmed by a delay Tref, and the feedback clock as trimmed by a delay Tfb. By using these three phases at the appropriate time, the measurement is aware of the Tac trim for both positive (Tref) and negative (Tfb) trims. Specifically, measurement 'start' and 'stop' signals each pass through only one of delays Tref and Tfb, such that error in the measurement is a function of both Tref and Tfb. This improves the accuracy of the measurement such that additional shifting of the DLL is not necessary after initialization, and allows a wide trim range even for high clock frequencies.

Figure 4:
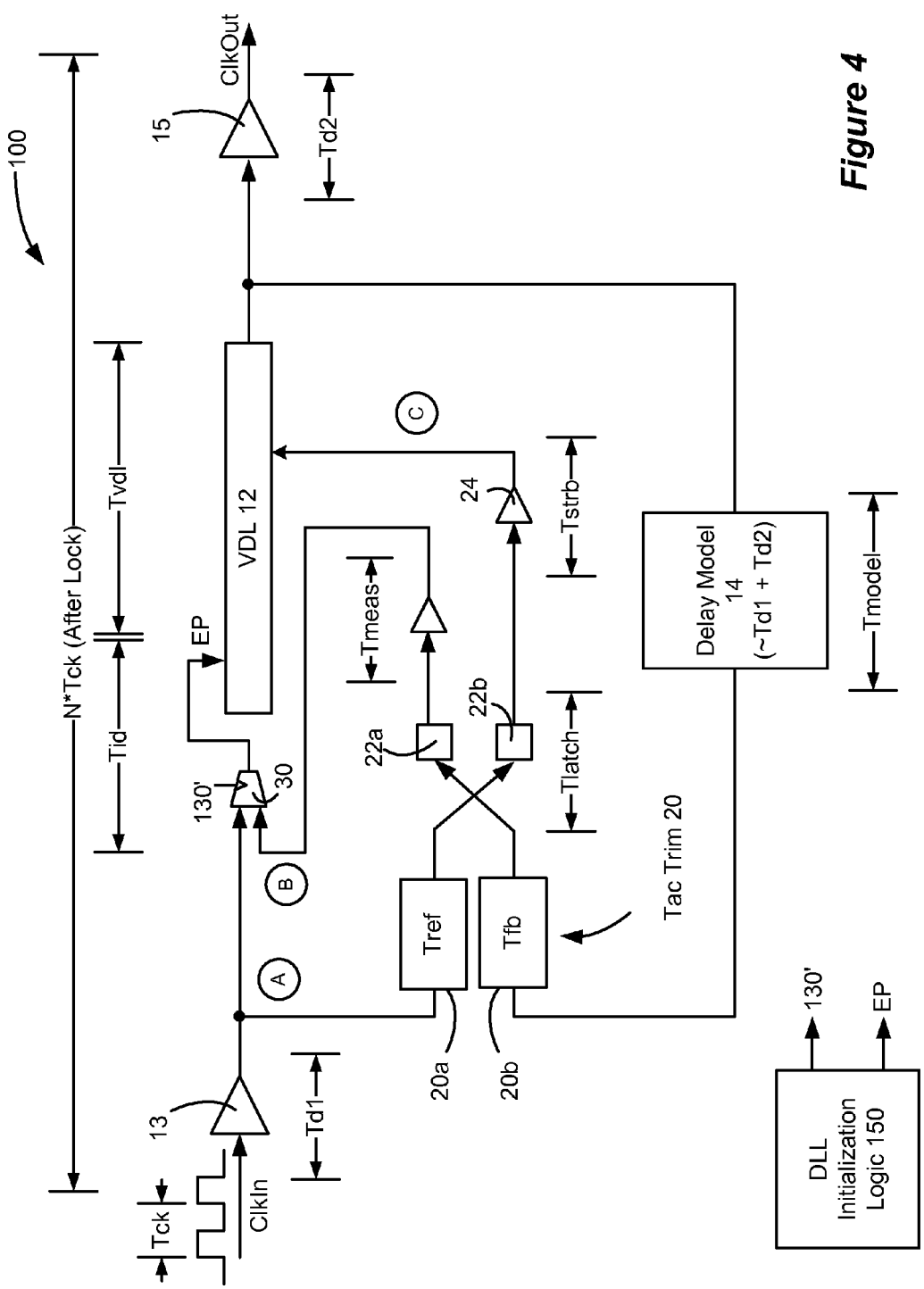
FIG. 4 illustrates improved DLL initialization circuitry useable in a DLL such as that shown in FIG. 1.

An embodiment of improved DLL initialization circuitry 100 is shown in FIG. 4. As a comparison to the prior art circuitry of FIG. 2 reveals, the circuitry of FIG. 4 is simpler in that MUX 32 and its associated control signal 32' have been removed from the circuit. Additionally, DLL initialization logic 150 has been changed to modify the control signal 130' passed to MUX 30, as will be explained further below.

The measurement is improved for Tac trim by using a three-phase approach. Rather than sending the trimmed (A) signal around the loop to generate (B), (A) is used to generate (B) and then (A) is used to generate (C). This makes the measurement aware of the trim, whether in Tref or in Tfb.

This improved methodology takes advantage of the MUX 30 that was already in place in front of the VDL 12. In the method and circuitry of the prior art (FIG. 2), MUX 30 only allowed its bottom input (point (B)) to enter the VDL 12 throughout the measurement process. By contrast, MUX 30 is set to first pass its top input (point (A)), and then later in the process, it is changed to allow (B) into the delay line.

Thus, a 'start' clock pulse starting at point (A) is passed immediately into the VDL 12, whose entry point (EP) is set to the far right stage of the VDL, such that Tvd1=0 (or whose exit point is set to the far left stage in such embodiments). Thereafter, the 'start' pulse travels through the delay model 14, through delay 20b (Tfb), through latch 22a (where the pulse is converted to an edge), and through measure buffer circuitry to point (B). At this point, the 'start' signal (edge) is controlled by 130' to pass through the MUX 30 into the first (left-most) stage of the VDL 12. As before, the DLL initialization logic 150 modifies the entry point (EP) (or exit point) throughout the initialization process. Once the 'start' signal is moving through the VDL, it will once again be captured by the 'stop' signal (C).

This modified path for the 'start' signal yields the following delay between points (A) and (B):

$$\text{Start signal from }(A)\text{ to }(B)=T\text{id}+T\text{model}+Tfb+T\text{latch}+T\text{meas} \quad \text{(Eq. 7)}$$

The 'stop' signal remains the same as discussed in the Background section. By way of review, the 'stop' clock pulse also begins at point (A), but uses a later clock pulse some N cycles after the pulse used as the 'start' clock pulse discussed above. This later clock pulse does not pass through the VDL 12, but instead goes through Tref delay 20a, to latch 22b (where it is converted to an edge), and through strobe circuitry 24 to point (C). Because the 'stop' signal starts some N*Tck after the 'start' signal, the time it takes for the stop signal to transgress its route is:

$$\text{Stop signal from }(A)\text{ to }(C)=N*Tck+T\text{ref}+T\text{latch}+T\text{strb} \quad \text{(Eq. 8)}$$

Figure 1:
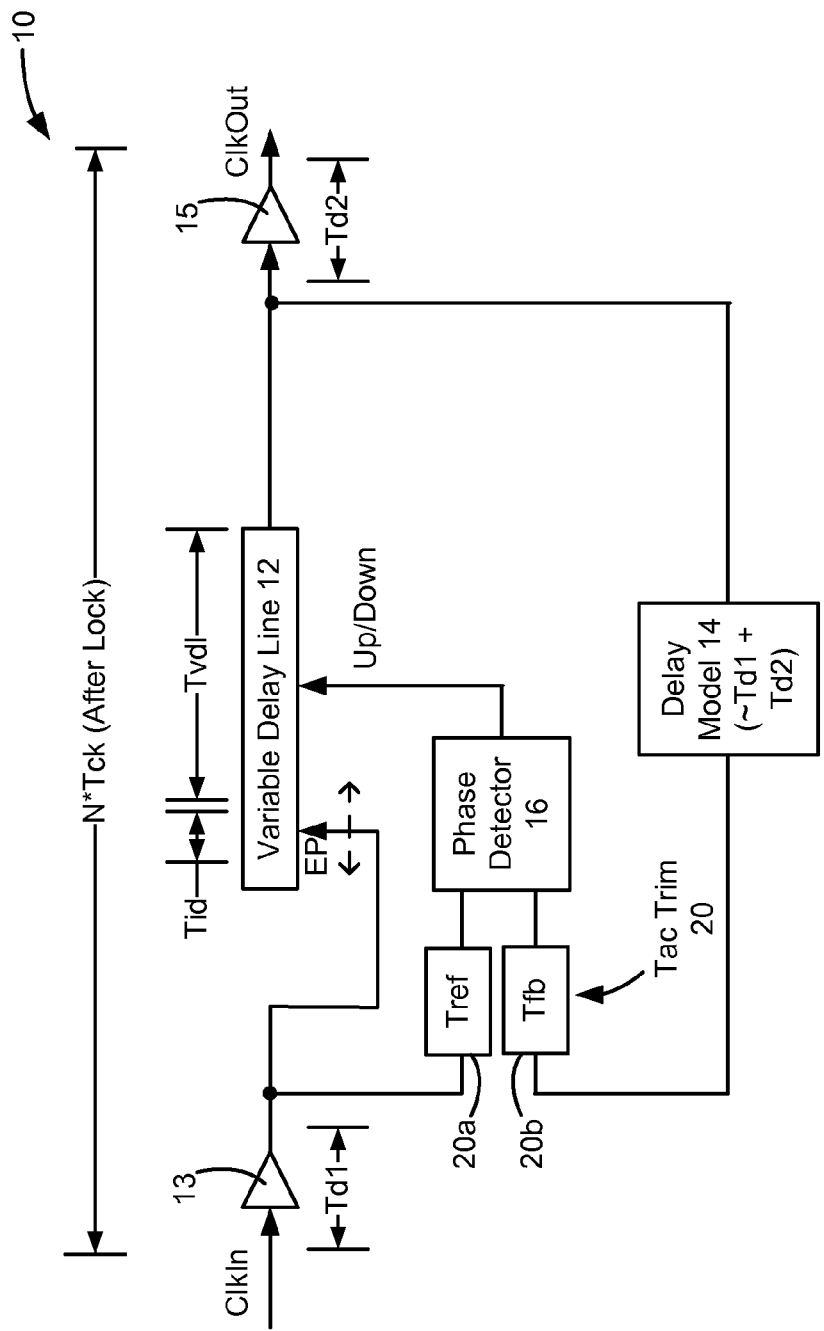
FIG. 1 illustrates a prior art delay locked loop (DLL).
Figure 2:
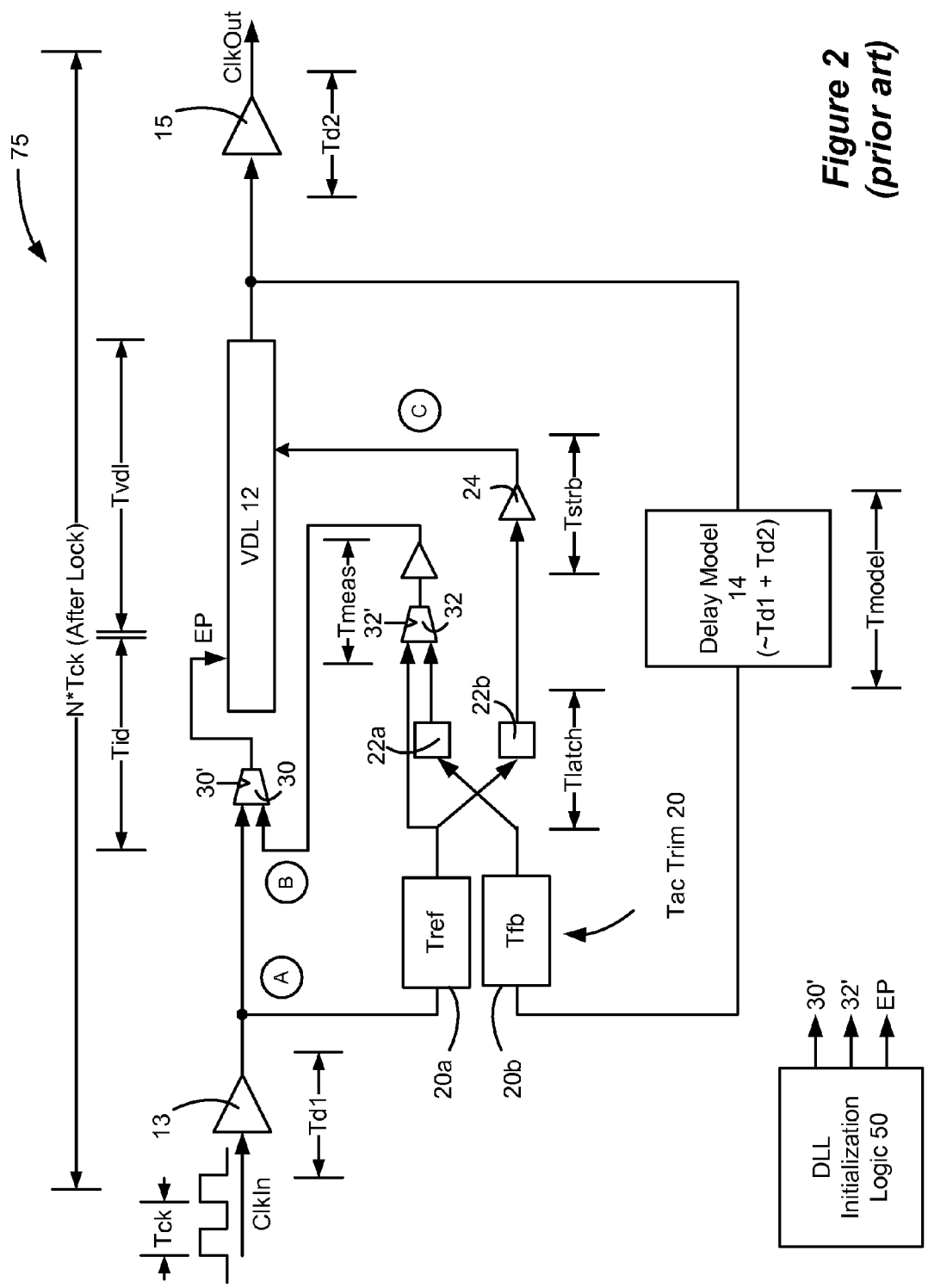
FIG. 2 illustrates the DLL initialization circuitry of the DLL of FIG. 1.
Figure 3:
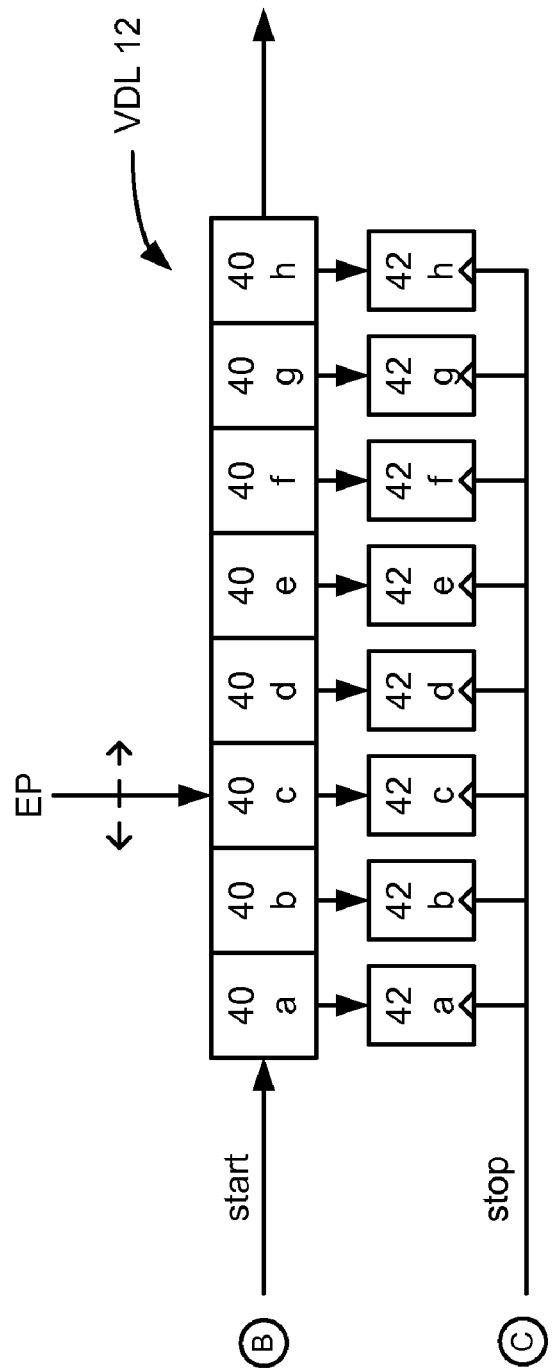
FIG. 3 illustrates the capturing of the start signal using the stop signal to estimate the Tvd1 necessary to initialize the DLL of FIG. 1 to a locked condition.

Note that unlike the prior art methodology as discussed with reference to FIG. 2, the 'start' signal does not pass through the Tref delay 20a. Instead, only the 'stop' signal passes through the Tref delay 20a. Likewise, only the 'start' signal passes through Tfb delay 20b. As a result, the measurement, Tvd1(meas), accounts for both trimmed delay terms:

$$Tvd1(\text{meas})=\text{Stop}-\text{Start}$$

$$Tvd1(\text{meas})=N*Tck+T\text{ref}+T\text{strb}-Tfb-T\text{meas}-T\text{id}-T\text{model} \quad \text{(Eq. 9)}$$

Because the ideal lock condition of Equations (1) and (2) does not change, and keeping in mind that Tmodel means to approximate Td1+Td2, the measured error term is:

$$\text{Error}=Tvd1(\text{meas})-Tvd1(\text{ideal})=N*Tck+T\text{ref}+T\text{strb}-Tfb-T\text{meas}-T\text{id}-T\text{model}-[N*Tck-(Td1+T\text{id}+Td2)]=T\text{ref}+T\text{strb}-Tfb-T\text{meas} \quad \text{(Eq. 10)}$$

As before, Tstrb and Tmeas are still static and can be trimmed out of the measurement using tuning delays.

When the error term of Equation (10) is compared to the error term of Equation (6) of the prior art, it is noticed that the error term is a function of both Tref and Tfb. Therefore, the measurement is now aware of the Tac trim, whether in the Tref (positive Tac) or Tfb (negative Tac) path, and that known value, like Tstrb and Tmeas, can now be applied to minimize the error in Equation (10) to essentially zero. As a result, after the initialization, there is no need for corrections due to positive Tac adjustments, and the DLL 10 can lock more easily and quickly, with less power consumption. Additionally, the risk posed in the prior art with respect to the DLL 10 performing further shifting of the variable delay line (possibly in the wrong direction) to establish a lock is alleviated.

One of ordinary skill will understand that the disclosed technique can be employed even in situations in which the output clock, ClkOut, is not perfectly in synchronization with the input clock, ClkIn. In other words, an ideal lock can comprise a relationship in which some set amount of phase, $T(\Phi)$, exists between the input clock and the output clock, e.g., $$Tvd1(\text{ideal})+Td1+T\text{id}+Td2=N*Tck+T(\Phi) \quad \text{(Eq. 11)}$$

In this case, the time difference attributable to the desired phase difference, $T(\Phi)$, a known value, is trimmable out of the Equation (10), but that error equation still remains a function of Tref and Tfb. In short, the technique is still applicable, and a lock achievable, even if the input clock, ClkIn, and the output clock, ClkOut, are not perfectly in phase.

Moreover, one of ordinary skill in the art will understand that the disclosed initialization technique and circuitry will have applicability to the processing of clock signals even when delays outside of the loop, such as the delays represented by element numerals 13 and 15 (see FIG. 4), are not present or are negligible. In such a case, the delay model 14 simply needs to be appropriately adjusted, or (if both delays Td1 and Td2 are negligible or non-existent) dispensed with entirely.

Additionally, while the disclosed technique and circuitry have been directed to the problem of adjustment of the Tac parameter in a SDRAM, one skilled in the art will recognize that the technique is not so limited. For example, the DLL initialization logic 150 as modified can operate so as to provide benefits of the disclosed embodiment in other applications.

While preferred embodiments of the invention have been disclosed, it should be understood that the disclosed circuitry can be achieved in many different ways to the same useful ends as described herein. In short, it should be understood that the inventive concepts disclosed herein are capable of many modifications. To the extent such modifications fall within the scope of the appended claims and their equivalents, they are intended to be covered by this patent.

What is claimed is:

1. A method for initializing a delay locked loop in an integrated circuit having an input clock and an output clock separated by a variable delay line, wherein the loop comprises a feedback delay for ultimately receiving the output clock, the method comprising:
    measuring as a first value the progression of a start signal through the variable delay line using a stop signal, wherein the stop signal passes through a reference delay but not the feedback delay, and wherein the start signal passes through the feedback delay but not the reference delay; and
    determining an entry or exit point of the variable delay line for the input clock by adjusting the first value.

2. The method of claim 1, wherein the first value is adjusted to achieve a set phase relationship between the input clock and the output clock.

3. The method of claim 2, wherein the set phase relationship is zero degrees.

4. The method of claim 1, wherein the integrated circuit comprises a synchronous dynamic access memory (SDRAM), and wherein the feedback delay shifts access time (Tac) negatively and wherein the reference delay shifts Tac positively.

5. The method of claim 1, wherein the start and stop signals originate as different pulses of the input clock.

6. The method of claim 1, wherein the reference delay and feedback delay are independently trimmable.

7. The method of claim 1, wherein the first value is expressible as a number of stages of the variable delay line.

8. The method of claim 1, wherein the stop signal measures the first value by controlling latches coupled to stages of the variable delay line.

9. A method for initializing a delay locked loop in an integrated circuit having an input clock and an output clock separated by a variable delay line having a number of stages, wherein the loop comprises a feedback delay for ultimately receiving the output clock, the method comprising:
    sending a start signal on a first path, the first path spanning from an input of the variable delay line to an output of the variable delay line thus bypassing the stages of the variable delay line, through the feedback delay, back to the input of the variable delay line, and through the stages of the variable delay line, wherein the first path does not include a reference delay; and
    sending a stop signal on a second path to capture the start signal, the second path spanning from the input of the variable delay line through the reference delay and to the variable delay line, wherein the stop signal is used to capture a number of stages that the start signal has progressed through the variable delay line, wherein the number of stages represents a first value.

10. The method of claim 9, further comprising;
    comparing the first value to a second value, wherein the second value indicates an set phase relationship between the input clock and the output clock; and
    initializing the delay in the variable delay line on the basis of the comparison.

11. A method for initializing a delay locked loop in an integrated circuit having an input clock and an output clock separated by a variable delay line, wherein the loop comprises trim circuitry for adjusting Tac, the method comprising:
    measuring as a first value the propagation of a start signal through the variable delay line;
    subtracting the first value from a second value indicative of a desired phase relationship between input clock and the output clock to derive an error term, wherein the error term is a function of positive and negative Tac adjustment to the trim circuitry; and
    using the error term to initialize the variable delay line.

12. The method of claim 11, wherein the integrated circuit comprises a SDRAM.

13. The method of claim 11, wherein the second value comprise a lock condition in which the input clock is in phase with the output clock.

14. The method of claim 11, wherein the start and stop signals originate as different pulses of the input clock.

15. The method of claim 11, wherein the first value is expressible as a number of stages of the variable delay line.

16. The method of claim 11, wherein initializing the variable delay line comprises initializing the entry point or exit point of the input clock into or from a particular stage of the delay line.

17. The method of claim 11, wherein the delay locked loop further comprises a first delay between the input clock and an input to the variable delay line, a second delay between an output of the variable delay line and the output clock, and a delay model between the output of the variable delay line and the trim circuitry, wherein the delay model comprises a delay equal to the sum of the first delay and the second delay.

18. Initialization circuitry for a delay locked loop in an integrated circuit, comprising:
    a variable delay line for receiving an input clock signal;
    a reference delay for receiving the input clock signal; and
    a feedback delay for receiving an output of the variable delay line,
    wherein an output of the reference delay during initialization of the delay locked loop only generates a stop signal for capturing a start signal as it progresses through the variable delay line to measure an initial delay for the variable delay line.

19. The initialization circuitry of claim 18, wherein the integrated circuit comprises a SDRAM, and wherein the feedback delay shifts Tac negatively and wherein the reference delay shifts Tac positively.

20. The initialization circuitry of claim 18, further comprising a first delay between the input clock and an input to the variable delay line, a second delay between an output of the variable delay line and the output clock, and a delay model between the output of the variable delay line and the feedback delay, wherein the delay model comprises a delay equal to the sum of the first delay and the second delay.

21. The initialization circuitry of claim 18, further comprising a multiplexer, wherein the multiplexer first passes the start signal to the variable delay line, and then later passes the start signal as passed through the loop to the variable delay line.

22. The initialization circuitry of claim 18, further comprising latch circuitry controllable by the stop signal for capturing the start signal as it progresses through the variable delay line.

23. The initialization circuitry of claim 18, further comprising a latch coupled to an output of the feedback delay, and a latch coupled to an output of the reference delay.

24. Initialization circuitry for a delay locked loop in an integrated circuit, comprising:
 a variable delay line for receiving an input clock signal and for producing an output clock signal;
 a reference delay for receiving the input to the variable delay line; and
 a feedback delay for ultimately receiving the output clock signal,
 wherein an output of the feedback delay only generates a start signal that progresses through the variable delay line; and
 wherein an output of the reference delay only generates a stop signal for capturing the start signal as progresses through the variable delay line.

25. The initialization circuitry of claim 24, wherein the integrated circuit comprises a SDRAM, and wherein the feedback delay shifts Tac negatively and wherein the reference delay shifts Tac positively.

26. The initialization circuitry of claim 24, wherein the staff and stop signals originate as different pulses of the input clock.

27. The initialization circuitry of claim 24, wherein the reference delay and feedback delay are independently trimmable.

28. The initialization circuitry of claim 24, further comprising a first delay between the input clock and an input to the variable delay line, a second delay between an output of the variable delay line and the output clock, and a delay model between the output of the variable delay line and the feedback delay, wherein the delay model comprises a delay equal to the sum of the first delay and the second delay.

* * * * *

UNITED STATES PATENT AND TRADEMARK OFFICE
CERTIFICATE OF CORRECTION

PATENT NO. : 7,728,639 B2
APPLICATION NO. : 12/247672
DATED : June 1, 2010
INVENTOR(S) : Tyler Gomm et al.

Page 1 of 1

It is certified that error appears in the above-identified patent and that said Letters Patent is hereby corrected as shown below:

In column 10, line 12, in Claim 26, delete "staff" and insert -- start --, therefor.

Signed and Sealed this

Twenty-fourth Day of August, 2010

David J. Kappos
*Director of the United States Patent and Trademark Office*